United States Patent
Fujii

(10) Patent No.: US 11,656,753 B2
(45) Date of Patent: May 23, 2023

(54) INFORMATION PROCESSING DEVICE AND METHOD DISPLAYING AT LEAST TWO APPARATUSES FOR VIRTUALLY CHECKING INTERFERENCE

(71) Applicant: CANON KABUSHIKI KAISHA, Tokyo (JP)

(72) Inventor: Nobuaki Fujii, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/151,947

(22) Filed: Jan. 19, 2021

(65) Prior Publication Data

US 2021/0240337 A1    Aug. 5, 2021

(30) Foreign Application Priority Data

Jan. 31, 2020  (JP) .............................. JP2020-014674
Oct. 29, 2020  (JP) .............................. JP2020-181811

(51) Int. Cl.
  *G06F 3/04847* (2022.01)
(52) U.S. Cl.
  CPC ............................... *G06F 3/04847* (2013.01)
(58) Field of Classification Search
  CPC ............... G06F 3/04847; G06F 30/17; G05B 2219/32351; G05B 2219/49157; G05B 19/41885; G05B 19/4069; G05B 19/19; G05B 2219/35323; Y02P 90/02; B25J 9/023
See application file for complete search history.

(56) References Cited

U.S. PATENT DOCUMENTS

| | | | | |
|---|---|---|---|---|
| 6,330,495 | B1 * | 12/2001 | Kaneko | B25J 9/1671 |
| | | | | 700/264 |
| 7,937,186 | B2 | 5/2011 | Nagatsuka | |
| 8,024,165 | B2 | 9/2011 | Kato | |
| 9,910,761 | B1 * | 3/2018 | Jules | G06F 11/3664 |
| 10,625,948 | B2 | 4/2020 | Fujii | |
| 2007/0150093 | A1 * | 6/2007 | Nagatsuka | B25J 9/1682 |
| | | | | 700/235 |
| 2007/0233452 | A1 * | 10/2007 | Sasaki | G06F 30/20 |
| | | | | 703/22 |

(Continued)

FOREIGN PATENT DOCUMENTS

| | | |
|---|---|---|
| JP | 2000-326280 | 11/2000 |
| JP | 2007-164417 | 6/2007 |

(Continued)

OTHER PUBLICATIONS

Ko, M., Ahn, E., Park S. (2013). A concurrent design methodology of a production system for virtual commissioning. Concurrent Engineering, 21(2) 129-140. https://doi.org/10.1177/1063293X13476070 (Year: 2013).*

*Primary Examiner* — John T Repsher, III
(74) *Attorney, Agent, or Firm* — Venable LLP

(57) ABSTRACT

An information processing device is configured to virtually execute motion of a device including a plurality of apparatuses. The information processing device includes a display portion and a control portion. The control portion is configured to extract an apparatus to be virtually moved, from the apparatuses on a basis of movement ranges of the apparatuses and display the apparatus on the display portion, as a check object.

31 Claims, 9 Drawing Sheets

(56) References Cited

U.S. PATENT DOCUMENTS

| | | | |
|---|---|---|---|
| 2008/0201004 A1 | 8/2008 | Kato | |
| 2011/0054685 A1* | 3/2011 | Wada | B25J 9/1664 |
| | | | 700/252 |
| 2016/0332297 A1* | 11/2016 | Sugaya | G06F 3/04842 |
| 2019/0051049 A1* | 2/2019 | Shimakawa | G06F 9/45508 |
| 2020/0306967 A1* | 10/2020 | Takahashi | B25J 9/1666 |

FOREIGN PATENT DOCUMENTS

| | | |
|---|---|---|
| JP | 2008-234622 | 10/2008 |
| JP | 2017-177283 | 10/2017 |

\* cited by examiner

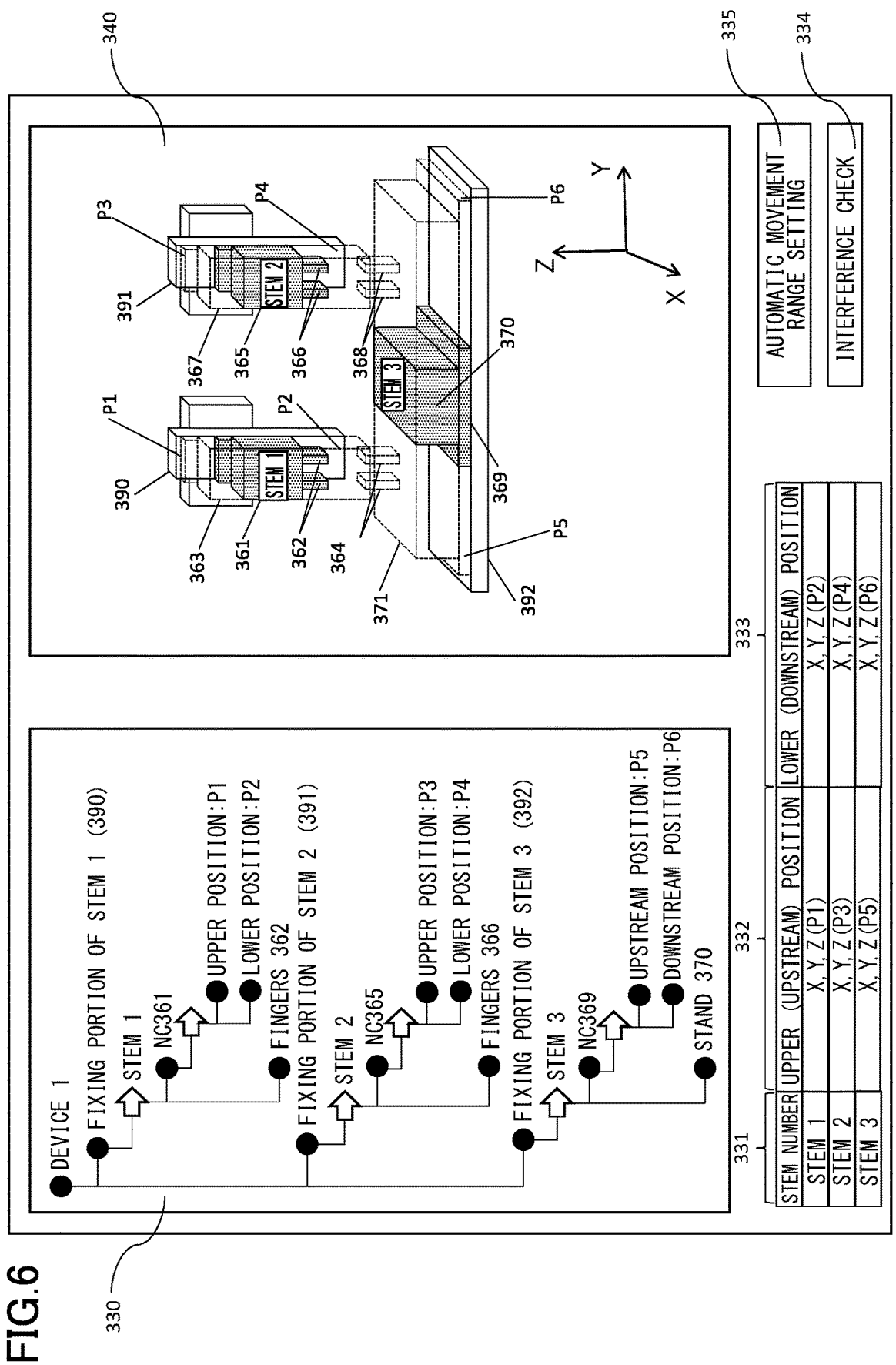

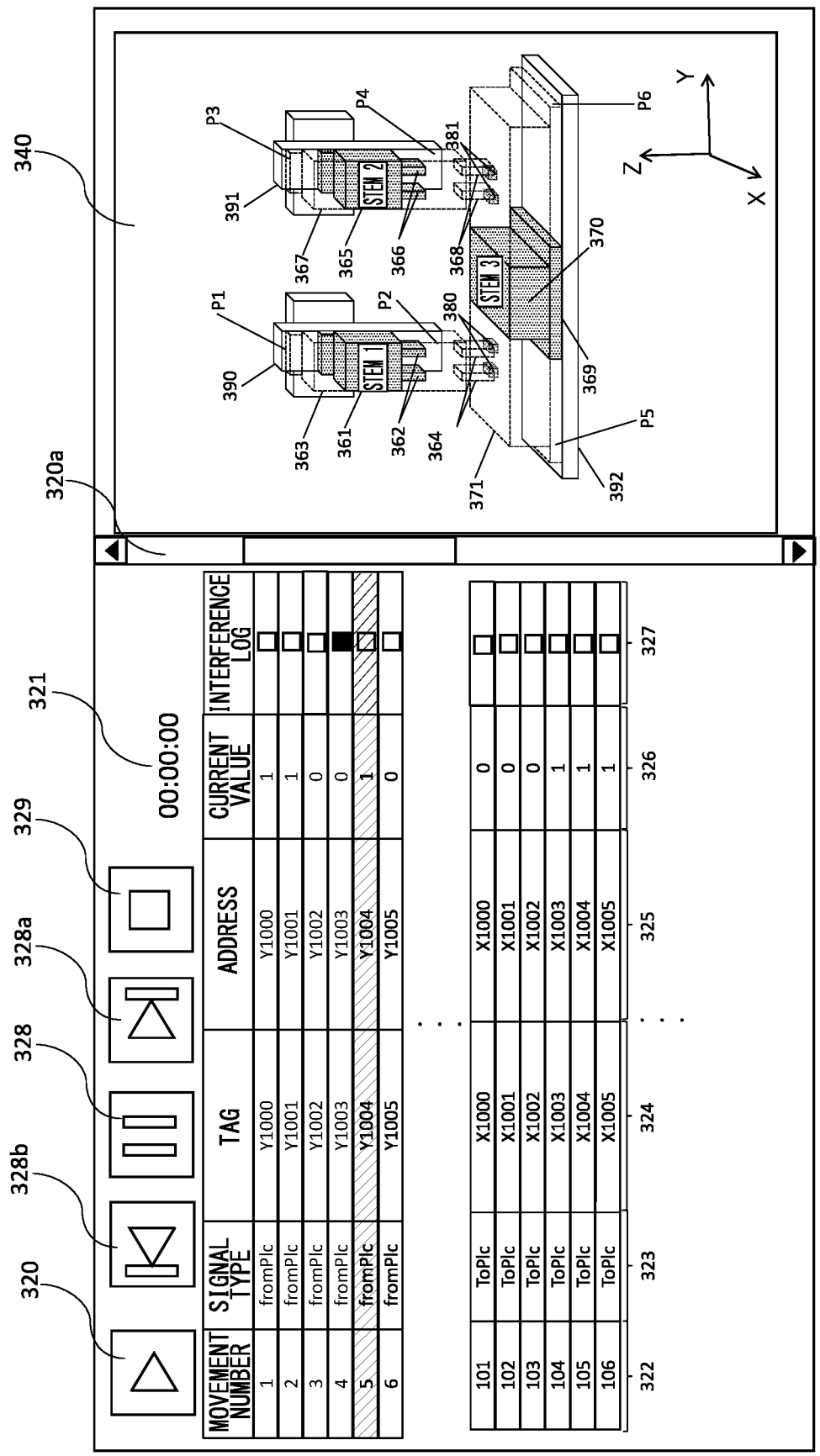

INFORMATION PROCESSING DEVICE AND METHOD DISPLAYING AT LEAST TWO APPARATUSES FOR VIRTUALLY CHECKING INTERFERENCE

BACKGROUND OF THE INVENTION

Field of the Invention

The present invention relates to an information processing device and an information processing method.

Description of the Related Art

In the field of production devices, the period of time (lead time) taken from when the design of a production device is started until when the production device is actually operated and put into practical use is desired to be shortened. For this purpose, instead of checking a design error of the mechanism or a bug of the operation program by using the production device after the production device is actually made, the design error or the bug is checked in a design stage by operating the production device in a virtual space. In addition, even after the production device is made, if the operation program is changed or modified, a design error of the mechanism or a bug of the operation program may be checked before the production device is actually operated.

For example, Japanese Patent Application Publication No. 2008-234622 discloses a trajectory-interference check program. The trajectory-interference check program creates trajectory model data by moving virtual models, and determines whether there is the presence of an overlap (overlap model) between one trajectory model and another trajectory model in all combinations of the trajectory models. If there is the presence of an overlap (overlap model) between trajectory models, the trajectory-interference check program determines a start time and an end time of interference between each virtual model and the overlap model. Then the trajectory-interference check program determines for each overlap model whether a period of time in which the overlap model interferes with one virtual model overlaps with a period of time in which the overlap model interferes with another virtual model. If the former period of time overlaps with the latter period of time, the trajectory-interference check program determines that the interference occurs in the virtual models.

In the technique described in Japanese Patent Application Publication No. 2008-234622, however, since all the combinations of the trajectory models are checked, the amount of information processing will increase, and an operator cannot efficiently check the operation of a device when the operator virtually checks the operation of the device.

In view of the above-described problem, the present invention provides an information processing device that allows an operator to efficiently check the operation of a device when the operator virtually checks the operation of the device.

SUMMARY OF THE INVENTION

According to a first aspect of the present invention, an information processing device is configured to virtually execute motion of a device including a plurality of apparatuses. The information processing device includes a display portion and a control portion. The control portion is configured to extract an apparatus to be virtually moved, from the apparatuses on a basis of movement ranges of the apparatuses and display the apparatus on the display portion, as a check object.

According to a second aspect of the present invention, an information processing method that virtually moves a device including a plurality of apparatuses is executed by a control portion. The information processing method includes extracting an apparatus to be virtually moved, from the apparatuses on the basis of movement ranges of the apparatuses, and displaying the apparatus on a display portion, as a check object.

Further features of the present invention will become apparent from the following description of exemplary embodiments with reference to the attached drawings.

BRIEF DESCRIPTION OF THE DRAWINGS

FIG. 6 is an example of a setting screen of the embodiment.

FIG. 9 is an example of an execution screen of the embodiment.

DESCRIPTION OF THE EMBODIMENTS

Hereinafter, an embodiment of the present invention will be described with reference to the accompanying drawings. Note that since the embodiment described below is merely one example, detailed configurations thereof may be modified as appropriate by a person skilled in the art without departing the spirit of the present invention. In addition, since numerical values described in the embodiment are merely numerical values for reference, they are not intended to limit the present invention. In addition, in the figures that will be referred to in the description of the following embodiment and example, a component having an identical reference number is given an identical function, unless specified otherwise. In addition, in the figures described below, arrows X, Y, and Z indicate a world coordinate system of the whole device and its surroundings, and a local coordinate system xyz may be used as appropriate, for example, for controlling a robot, fingers, joints, and the like.

Figure 1:
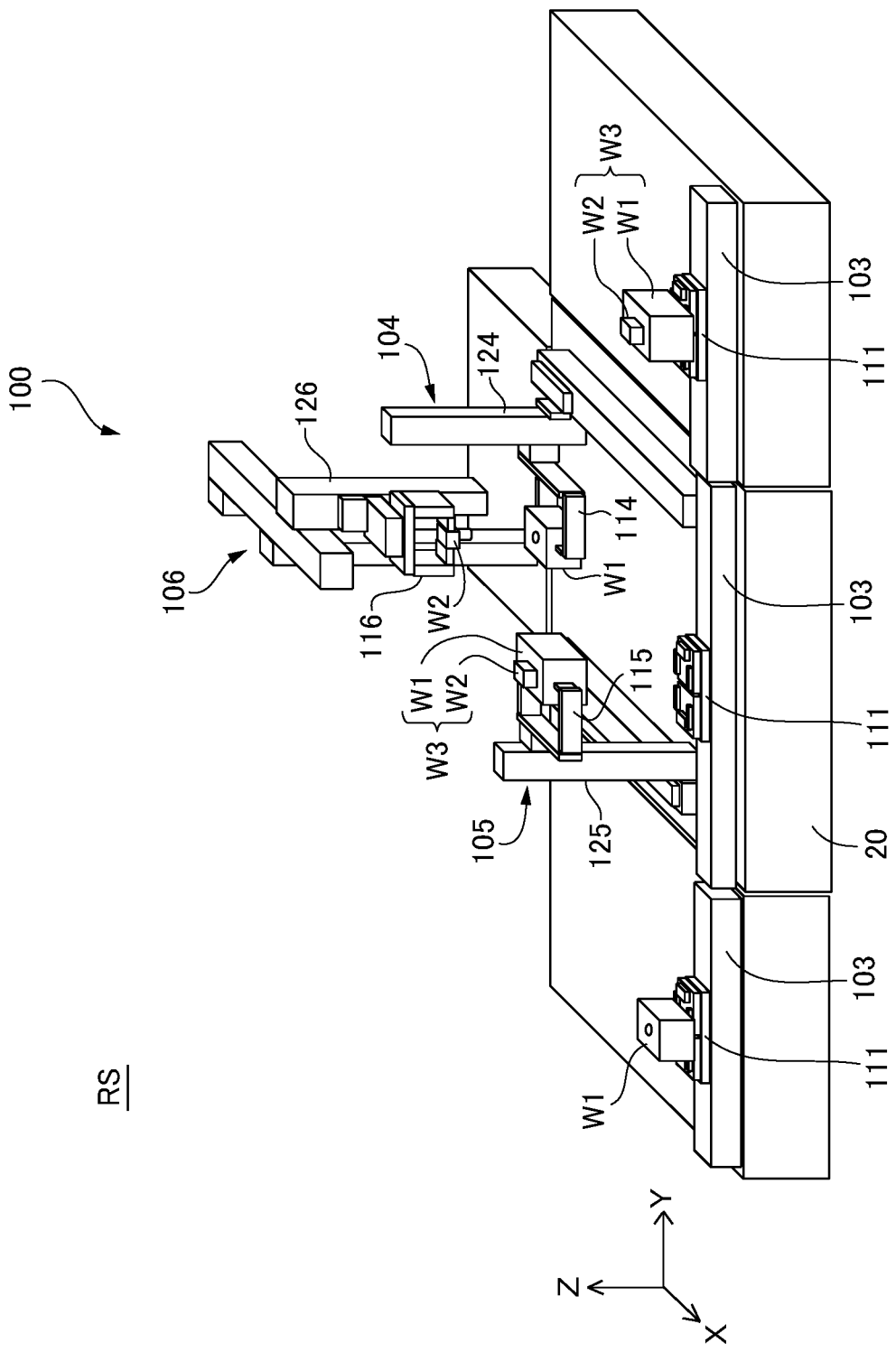
FIG. 1 is a schematic diagram of an automatic assembling device 100 of an embodiment.

FIG. 1 is a schematic diagram that illustrates an example of an automatic assembling device 100 of a system of the embodiment. FIG. 1 illustrates the automatic assembling device 100 in a real space RS. The automatic assembling device 100 illustrated in FIG. 1 is installed in a factory, for example. The automatic assembling device 100 is one example of a plurality of automatic machines, and includes three Cartesian coordinate robots 104, 105, and 106. The three Cartesian coordinate robots 104, 105, and 106 are disposed on a stand 20. By using the Cartesian coordinate robots 104, 105, and 106, a workpiece W2 that is a second workpiece is assembled, as a material, to a workpiece W1 that is a first workpiece; and a workpiece W3 that is one example of a product is made.

A rail 103 is disposed on the stand 20, and a conveyance stand 111 on which the workpiece W1 or W3 is placed can move on the rail 103. The Cartesian coordinate robot 104 includes a hand 114 and a moving mechanism 124. The hand 114 is one example of a holding portion that can hold the workpiece W1, and the moving mechanism 124 moves the hand 114 in a translational direction. The Cartesian coordinate robot 105 includes a hand 115 and a moving mechanism 125. The hand 115 is one example of a holding portion that can hold the workpiece W1, and the moving mechanism 125 moves the hand 115 in a translational direction. The Cartesian coordinate robot 106 includes a hand 116 and a moving mechanism 126. The hand 116 is one example of a holding portion that can hold the workpiece W2, and the moving mechanism 126 moves the hand 116 in a translational direction. The three Cartesian coordinate robots 104, 105, and 106 are disposed such that a movement range of one robot overlaps with a movement range of another robot.

Each of the Cartesian coordinate robots 104 and 105 holds a workpiece W1 having been conveyed by the conveyance stand 111. The Cartesian coordinate robot 106 holds the workpiece W2 having been conveyed by a conveyance device (not illustrated). The Cartesian coordinate robots 104 and 105 convey the workpiece W1 from a position at which the Cartesian coordinate robots 104 and 105 hold the workpiece W1, to a position at which the workpiece W2 is assembled to the workpiece W1. The Cartesian coordinate robot 106 holds the workpiece W2 and assembles the workpiece W2 to the workpiece W1 held by the Cartesian coordinate robot 104 or 105. The Cartesian coordinate robots 104 and 105 convey the workpiece W3, which is constituted by the workpieces W1 and W2, to the conveyance stand 111. The Cartesian coordinate robots 104 and 105 repeat the series of motions in an alternate manner.

Figure 2:
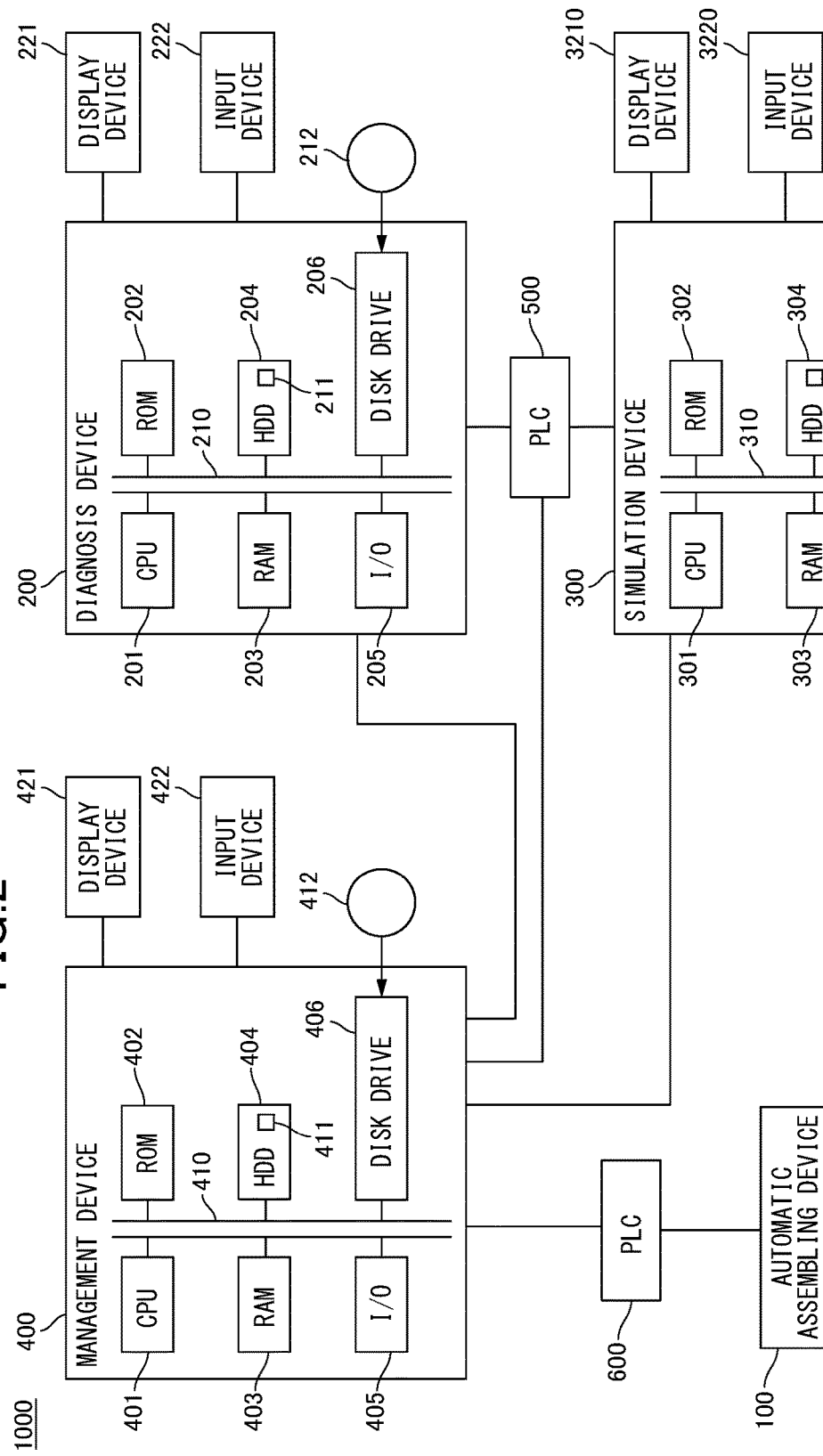
FIG. 2 is a control block diagram of a production system 1000 of the embodiment.

FIG. 2 is a control block diagram of a production system 1000 that is one example of a system of the embodiment. The production system 1000 includes the above-described automatic assembling device 100, a diagnosis device 200, a simulation device 300, and a management device 400. In addition, the production system 1000 includes a programmable logic controller (PLC) 500 that is one example of a first control portion, and a PLC 600 that is one example of a second control portion. As described later, the diagnosis device 200 and the simulation device 300 are computers (information processing devices).

The diagnosis device 200 is a computer, and includes a central processing unit (CPU) 201, which is a processor. The CPU 201 functions as a later-described diagnosis portion. In addition, the diagnosis device 200 includes a read only memory (ROM) 202, a random-access memory (RAM) 203, and a hard disk drive (HDD) 204, which serve as storage portions. In addition, the diagnosis device 200 includes an I/O 205 that is an input/output interface, and a disk drive 206. The CPU 201, the ROM 202, the RAM 203, the HDD 204, the I/O 205, and the disk drive 206 are communicatively connected with each other via a bus 210.

The ROM 202 is a non-transitory storage device. The ROM 202 stores a base program, which is read by the CPU 201 when the computer is started. The RAM 203 is a transitory storage device used for a computing process performed by the CPU 201. The HDD 204 is a non-transitory storage device that stores various types of data, such as results of a computing process performed by the CPU 201. In the present embodiment, the HDD 204 stores a diagnosis program 211 that causes the CPU 201 to function as the later-described diagnosis portion and execute part of a simulation method. The disk drive 206 can read various types of data and a program stored in a recording disk 212. The I/O 205 functions as a communication module that communicates with external devices. The I/O 205 is connected with a display device 221, an input device 222, the management device 400, and the PLC 500. The CPU 201 of the diagnosis device 200 can communicate with the management device 400 and the PLC 500 via the I/O 205. The display device 221 is a display that displays various images. The input device 222 is a device, such as a keyboard and mouse, through which an operator can input data.

The simulation device 300 is a computer, and includes a CPU 301, which is a processor. The CPU 301 functions as a later-described simulation portion. In addition, the simulation device 300 includes a ROM 302, a RAM 303, and an HDD 304, which serve as storage portions. In addition, the simulation device 300 includes an I/O 305 that is an input/output interface, and a disk drive 306. The CPU 301, the ROM 302, the RAM 303, the HDD 304, the I/O 305, and the disk drive 306 are communicatively connected with each other via a bus 310.

The ROM 302 is a non-transitory storage device. The ROM 302 stores a base program, which is read by the CPU 301 when the computer is started. The RAM 303 is a transitory storage device used for a computing process performed by the CPU 301. The HDD 304 is a non-transitory storage device that stores various types of data, such as results of a computing process performed by the CPU 301. In the present embodiment, the HDD 304 stores a simulation program 311 that causes the CPU 301 to function as the later-described simulation portion and execute part of the simulation method. The disk drive 306 can read various types of data and a program stored in a recording disk 312. The I/O 305 functions as a communication module that communicates with external devices. The I/O 305 is connected with a display device 3210, an input device 3220, the management device 400, and the PLC 500. The CPU 301 of the simulation device 300 can communicate with the management device 400 and the PLC 500 via the I/O 305. The display device 3210 is a display that displays various images. The input device 3220 is a device, such as a keyboard and mouse, through which an operator can input data.

The management device 400 is a computer, and includes a CPU 401, which is a processor. The CPU 401 functions as a later-described management portion. In addition, the management device 400 includes a ROM 402, a RAM 403, and an HDD 404, which serve as storage portions. In addition, the management device 400 includes an I/O 405 that is an input/output interface, and a disk drive 406. The CPU 401, the ROM 402, the RAM 403, the HDD 404, the I/O 405, and the disk drive 406 are communicatively connected with each other via a bus 410.

The ROM 402 is a non-transitory storage device. The ROM 402 stores a base program, which is read by the CPU 401 when the computer is started. The RAM 403 is a transitory storage device used for a computing process performed by the CPU 401. The HDD 404 is a non-transitory storage device that stores various types of data, such as results of a computing process performed by the CPU 401. The HDD 404 stores a management program 411 that causes the CPU 401 to function as the later-described management portion. The disk drive 406 can read various types of data and a program stored in a recording disk 412. The I/O 405 functions as a communication module that communicates with an external device. The I/O 405 is connected with a display device 421, an input device 422, the diagnosis device 200, the simulation device 300, the PLC 500, and the PLC 600. The CPU 401 of the management device 400 can communicate with the diagnosis device 200, the simulation device 300, the PLC 500, and the PLC 600 via the I/O 405. The display device 421 is a display that displays various images. The input device 422 is a device, such as a keyboard and mouse, through which an operator can input data. The PLC 600 is connected to the automatic assembling device 100.

The PLC 600 outputs a control signal to the automatic assembling device 100, depending on a ladder program 800. The ladder program 800 can be obtained through the diagnosis of a ladder program 800A. With the control signal, sequence control can be performed on the Cartesian coordinate robots 104, 105, and 106 of the automatic assembling device 100 in the real space. The PLC 500 has the same configuration as that of the PLC 600. The PLC 500 can perform sequence control on a virtual machine in a virtual space, by outputting a control signal to the simulation device 300.

In the present embodiment, a computer-readable non-transitory recording medium is the HDD 204, and the diagnosis program 211 is stored in the HDD 204. However, the present disclosure is not limited to this. The diagnosis program 211 may be stored in any recording medium as long as the recording medium is a computer-readable recording medium. The same holds true for the simulation program 311 and the management program 411. Specifically, the recording medium used to provide the diagnosis program 211, the simulation program 311, and the management program 411 to the computer may be a flexible disk, an optical disk, a magneto-optical disk, a magnetic tape, a nonvolatile memory, or the like.

Figure 3:
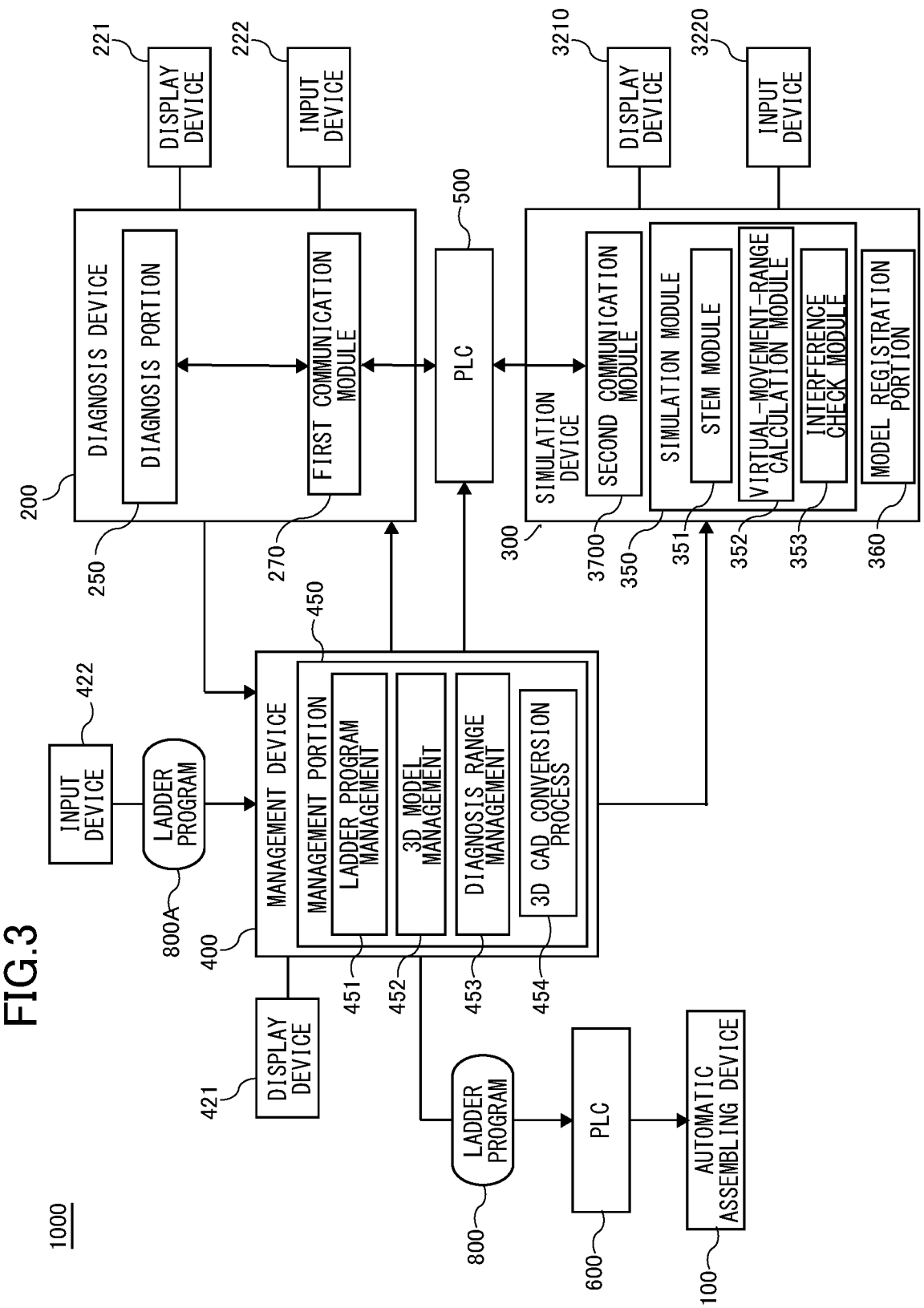
FIG. 3 is a control block diagram of the production system 1000 of the embodiment.

FIG. 3 is a functional block diagram of the production system 1000 of the embodiment. Since FIG. 3 illustrates the functional block diagram of the production system 1000 such that functions of the components are conceptually shown, the production system 1000 may not necessarily be physically configured as illustrated in FIG. 3. For example, the specific configuration of distribution and integration of the function blocks is not limited to the example of FIG. 3. Thus, part or all of the function blocks may be functionally or physically distributed or integrated in any units in accordance with use condition or the like. The system illustrated in FIG. 3 can be used as a supporting device (supporting system) when the production device is, for example, designed or debugged.

The CPU 201 of the diagnosis device 200 illustrated in FIG. 2 functions as a diagnosis portion 250 illustrated in FIG. 3, by executing the diagnosis program 211. The diagnosis portion 250 performs a simulation of operation, depending on the ladder program 800A stored in the PLC 500. The diagnosis device 200 includes a first communication module 270.

The diagnosis device 200 is connected to the simulation device 300 via the first communication module 270. Thus, the diagnosis device 200 performs the communication (on information) via the first communication module 270. The diagnosis portion 250 instructs the PLC 500 to perform a simulation of operation depending on the ladder program 800A. The status of the diagnosis device 200 is displayed on the display device 221.

The CPU 301 of the simulation device 300 illustrated in FIG. 2 functions as a simulation module 350 illustrated in FIG. 3, by executing the simulation program 311. In addition, part of the HDD 304, illustrated in FIG. 2, of the simulation device 300 functions as a model registration portion 360 illustrated in FIG. 3.

The simulation device 300, which includes the CPU and the memories, is an information processing device that performs a simulation of operation of an automatic machine such as a production device. The display device 3210 is a display. The input device 3220 includes a keyboard and a mouse. The simulation device 300 includes the simulation module 350 and a second communication module 3700. The status of the simulation device 300 is displayed on the display device 3210. The simulation device 300 is connected to the PLC 500 via the second communication module 3700. Thus, the simulation device 300 communicates with the PLC 500 via the second communication module 3700.

The simulation module 350 includes a stem module 351, a virtual-movement-range calculation module 352, and an interference check module 353. The simulation module 350 simulates the movement of a 3D-model virtual machine depending on a control signal from the PLC 500, in accordance with the 3D-model virtual machine registered in the model registration portion 360 and with the ladder program 800A. Note that although each of the diagnosis device 200 and the simulation device 300 has a display device and an input device in the present embodiment, the diagnosis device 200 and the simulation device 300 may be achieved by a single PC, and the single PC may have a single display device and a single input device.

The CPU 401 of the management device 400 illustrated in FIG. 2 functions as a management portion 450 illustrated in FIG. 3, by executing the management program 411. The management portion 450 executes a ladder program management 451, a 3D model management 452, a diagnosis range management 453, and a 3D CAD conversion process 454. In the diagnosis range management 453, a maximum range of movement of each mechanism of the automatic assembling device 100 is used.

The management portion 450 executes the 3D model management 452 for managing a 3D model of the mechanism of the automatic assembling device 100. The 3D model of the mechanism is inputted into the management portion 450 through the input device 422 operated by an operator, and registered in the HDD 404 of FIG. 2, for example. The 3D model of the mechanism is diagnosed by the diagnosis portion 250 of the diagnosis device 200. The management portion 450 obtains a diagnosis result of the mechanism from the diagnosis portion 250, and causes the display device 421 to display an image corresponding to the diagnosis result.

The management portion 450 performs the 3D CAD conversion process 454. In the 3D CAD conversion process 454, the 3D model of the mechanism of the automatic machine managed in the 3D model management 452 is converted to a model with a format in which the model can be simulated by the simulation module 350, and the converted model is sent to the simulation device 300. The 3D model sent by the management portion 450 is registered in the model registration portion 360 of the simulation device 300.

The movement of the 3D model is checked by the diagnosis device 200 and the simulation device 300, as described later; and the ladder program 800A is modified into the ladder program 800, as necessary. The management device 400 then outputs the ladder program 800 to the PLC

600. The PLC 600 controls the automatic assembling device 100 in the real space, depending on the ladder program 800.

In the diagnosis portion 250, the relationship between stems that move in the automatic machine (e.g., production device), and switches that move the stems is registered in accordance with the ladder program 800A. The stems are components to be simulated, and the relationship between the stems and the switches indicates how each stem moves in a maximum range of movement. When the movement of a specified stem of the automatic machine is to be checked (simulated) in the relationship, an operator specifies the stem in a screen displayed on the display device 221, by using the input device 222.

When the movement of the stem to be simulated is selected by using the input device 222, a switch signal is outputted from the diagnosis device 200 to move the stem. The switch signal to move the stem is sent to the PLC 500 via the first communication module 270.

Upon receiving the switch signal to move the stem, the PLC 500 calculates a signal to move the stem, and outputs the signal. The signal to move the stem is sent to the simulation module 350 via the second communication module 3700.

By using the signal sent from the PLC 500 and used to move the stem, the simulation module 350 determines a stem that is to be virtually moved in the virtual space. The stem module 351 stores information (e.g., point, velocity, acceleration, stroke) necessary to move the stem under the virtual control.

The stem module 351 moves each stem in the virtual space. The virtual-movement-range calculation module 352 uses a setting of stroke (movement range) of each stem, stored in the stem module 351; and calculates a movement range (of a maximum movement range) of the stem. While the stem module 351 simulates the movement of each stem, the interference check module 353 checks in real time whether each stem interferes with another component. Thus, an operator can view the movement of each stem in the virtual space, displayed on the display device 3210.

Since the ladder program 800A is provided to the diagnosis portion 250 for checking the operation of the ladder program 800A, a test that uses a switch for moving a stem can be automatically performed. The display device 3210 displays information on the simulation device 300. Thus, an operator can view the information displayed on the display device 3210, and can input information into the simulation device 300 by using a designer's machine connected to the input device 3220. That is, the operator can select a mechanism to be simulated, from among a plurality of mechanisms of the automatic machine (e.g., production device); and input the information on the mechanism, into the simulation device 300.

If the PLC 500 is emulated, the PLC 500 and the diagnosis portion 250 may be included in the simulation device 300. In this case, the first communication module 270 and the second communication module 3700 may not be used.

As described above, the information on the diagnosis device 200 is displayed on the display device 221, and the information on the simulation device 300 is displayed on the display device 3210. However, since the diagnosis device 200 and the simulation device 300 are communicatively connected with each other via the respective communication modules and the PLC 500, the information on the diagnosis device 200 may be displayed on the display device 3210, and the information on the simulation device 300 may be displayed on the display device 221.

Figure 4:
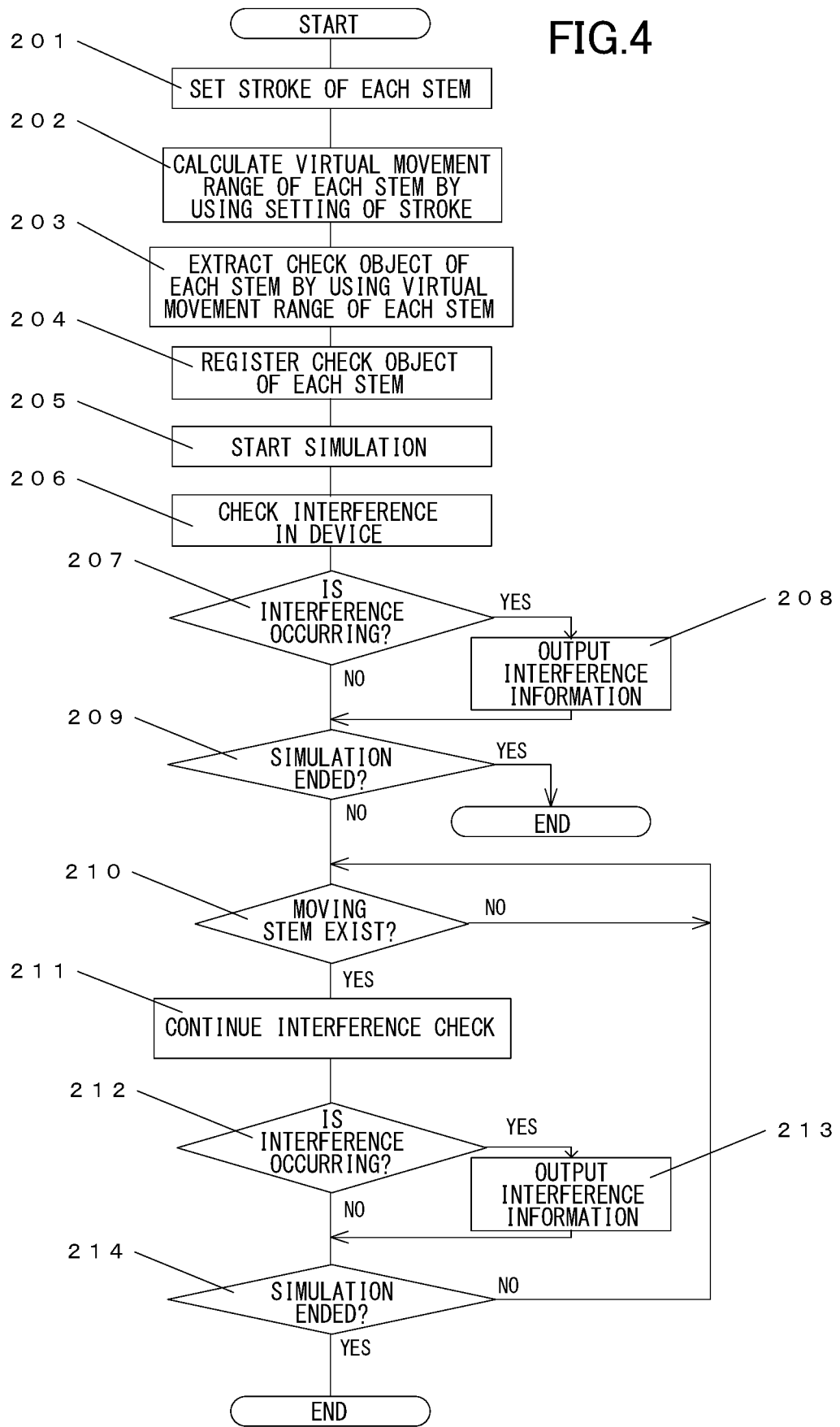
FIG. 4 is a control flow chart for executing a simulation of the embodiment.

Next, with reference to a functional block diagram of FIG. 3 and a flowchart of FIG. 4, an algorithm of an interference check function of the present embodiment will be specifically described. The algorithm of the interference check function is stored in the interference check module 353.

In Step 201 of the flowchart of FIG. 4, a stroke of each stem is set. In the present embodiment, the stroke of each stem is set by an operator by using the input device 3220 while watching the screen of the display device 3210. The setting data of the stroke of each stem is stored in the stem module 351 of the simulation module 350.

In Step 202, by using the stroke of each stem stored in the stem module 351, a movement range of each stem in the virtual space is calculated by the virtual-movement-range calculation module 352.

In Step 203, by using the calculated movement range of each stem in the virtual space, an area in which a movement range of one stem overlaps with a movement range of another stem is extracted (or calculated) as an interference check object.

In Step 204, the interference check object extracted (or calculated) for each stem is registered in the interference check module 353, as an interference check object of each stem.

In Step 205, a simulation using a virtual machine is started. In Step 206, a computation to determine whether an interference is occurring in the virtual machine is performed, and in Step 207, the process determines whether an interference is occurring.

If the process determines that an interference is occurring (Step 207: YES), then the process obtains, in Step 208, the information on the status of the PLC 500 via the second communication module 3700, and outputs the information on the status of the PLC 500 and the information on an area in which the interference is occurring (the process outputs those pieces of information as interference information).

If the process determines that no interference is occurring (Step 207: NO), then the process determines in Step 209 whether a request to end the simulation has been inputted via the input device 3220.

If the request to end the simulation has been inputted (Step 209: YES), then the process ends the simulation. If the request to end the simulation has not been inputted (Step 209: NO), then the process proceeds to Step 210, and determines whether there is a stem currently moving in the virtual machine. If there is no stem currently moving in the virtual machine (Step 210: NO), then the process repeats Step 210 until a stem currently moving in the virtual machine is detected.

If there is a stem currently moving in the virtual machine (Step 210: YES), then the process proceeds to Step 211 and performs setting to enable the interference check, in accordance with the registration of an interference check object of the moving stem. Then the process performs a computation to determine whether an interference is occurring between the moving stem and the interference check object, and determines in Step 212 whether the interference is occurring.

If the process determines that an interference is occurring (Step 212: YES), then the process obtains information on the status of the PLC 500, in Step 213, via the second communication module 3700; and outputs the information on the status of the PLC 500 and the information on an area in which the interference is occurring (the process outputs those pieces of information as interference information).

If the process determines that no interference is occurring (Step 212: NO), then the process determines in Step 214 whether a request to end the simulation has been inputted via the input device 3220 and all the movements have been checked.

If the request to end the simulation has been inputted, or all the movements have been checked (Step 214: YES), then the process ends the simulation. If the request to end the simulation has not been inputted, or all the movements have not been checked (Step 214: NO), then the process returns to Step 210 and determines again whether there is a stem currently moving in the virtual machine.

Figure 5A:
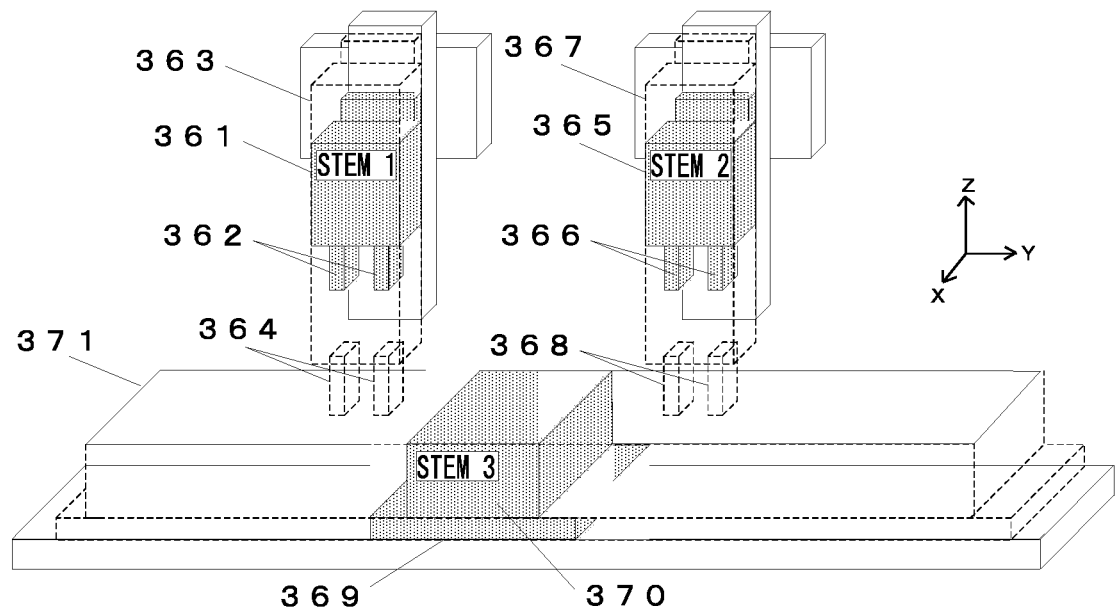
FIG. 5A is a diagram illustrating virtual model of part of the automatic assembling device 100 of the embodiment.
Figure 5B:
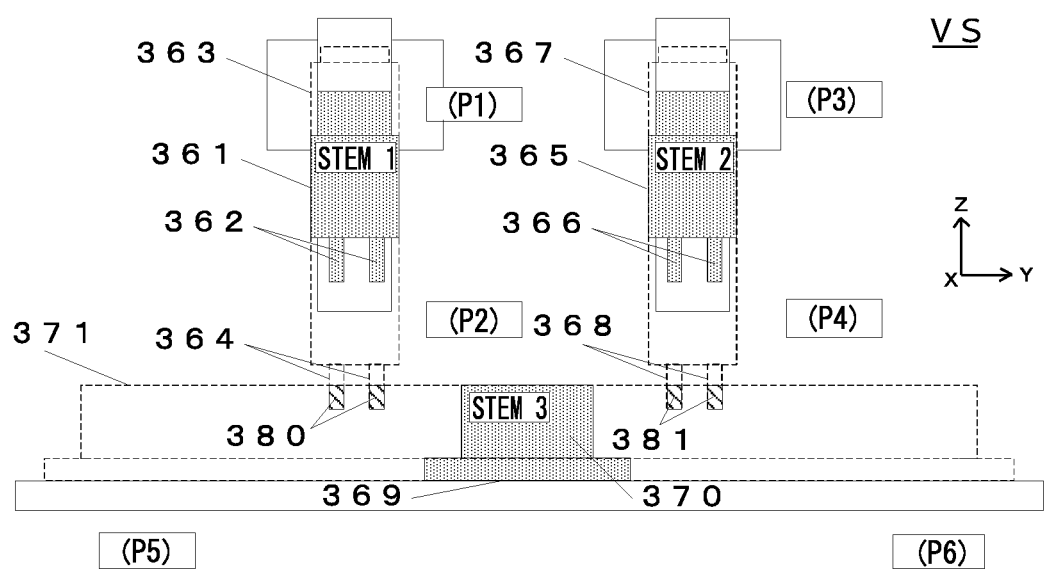
FIG. 5B is a diagram illustrating the virtual model of the part of the automatic assembling device 100 of the embodiment.

In the present embodiment, the simulation device 300 simulates an operation of an automatic machine, such as a production device, in a virtual space VS. FIGS. 5A and 5B illustrate part of the automatic assembling device 100 of FIG. 1 in the virtual space VS. FIG. 5A is a perspective view of the part of the automatic assembling device 100, and FIG. 5B is a front view of the part of the automatic assembling device 100.

As illustrated in FIGS. 5A and 5B, an NC 361 (stem 1) is an NC (numerically controlled object) that moves vertically, and has fingers 362 formed at the leading end of the NC 361. An NC 365 (stem 2) is an NC (numerically controlled object) that moves vertically, and has fingers 366 formed at the leading end of the NC 365. An NC 369 (stem 3) is an NC (numerically controlled object) that moves horizontally, and has a stand 370 formed on the top surface of the NC 369.

The part of the virtual automatic assembling device 100 illustrated in FIGS. 5A and 5B is simulated by moving a virtual model in the virtual space. With reference to FIGS. 4, 6, 7, 8, and 9, an example of the simulation will be described in detail.

FIG. 6 is an example of a setting screen displayed on the display device 221 or 3210 when the stroke (movement range) of each stem is set in Step 201 of FIG. 4. In FIG. 6, a stroke setting portion 330, a virtual-model display portion 340, an interference check button 334, and an automatic movement-range setting button 335 are illustrated. The stroke setting portion 330 is a portion to set the stroke of each stem. The virtual-model display portion 340 displays a virtual model of part of the automatic assembling device 100 illustrated in FIGS. 5A and 5B. The stroke setting portion 330 displays components, such as stems and fingers that constitute a device, in a tree view form. When a portion "device 1" is clicked, detailed information on the components is developed and displayed. The stem 1 is fixed to a fixing portion 390. When a portion "fixing portion 390 of stem 1" is clicked, items of "NC 361" and "fingers 362" are developed and displayed.

Similarly, the stem 2 is fixed to a fixing portion 391. When a portion "fixing portion 391 of stem 2" is clicked, items of "NC 365" and "fingers 366" are developed and displayed. The stem 3 is fixed to a fixing portion 392. When a portion "fixing portion 392 of stem 3" is clicked, items of "NC 369" and "stand 370" are developed and displayed.

When an item of "NC 361" is clicked, items to set specific values of the stroke of the stem 1 are developed and displayed. When an item of "upper position" or an item of "lower position" is clicked, the name "stem 1" is displayed in a column 331 that indicates a stem number, a cell to set the upper position is displayed in a column 332, and a cell to set the lower position is displayed in a column 333. In the present embodiment, a freely-selected position P1 in the XYZ coordinate system is set as the upper position of the stem 1, and a freely-selected position P2 in the XYZ coordinate system is set as the lower position of the stem 1, by using a keyboard or the like. The columns 332 and 333 are a position input portion.

Also in the stem 2 or 3, when an item of "NC 365" or "NC 369" is clicked, items to set specific values of the stroke are developed and displayed. When an item of "upper (upstream) position" or an item of "lower (downstream) position" is clicked, the name "stem 2" or "stem 3" is displayed in the column 331 that indicates a stem number, a cell to set the upper (upstream) position is displayed in the column 332, and a cell to set the lower (downstream) position is displayed in the column 333. In the present embodiment, a freely-selected position P3 in the XYZ coordinate system is set as the upper position of the stem 2, and a freely-selected position P4 in the XYZ coordinate system is set as the lower position of the stem 2, by using a keyboard or the like. In addition, a freely-selected position P5 in the XYZ coordinate system is set as the upstream position of the stem 3, and a freely-selected position P6 in the XYZ coordinate system is set as the downstream position of the stem 3, by using a keyboard or the like.

Note that although a keyboard is used to set the positions in the above-described example, the positions may be set in a different manner. For example, a cell to set a position may be selected first, and then a freely-selected position in the virtual-model display portion 340 may be specified by using a mouse for setting the position.

If a specified stem moves in its maximum range of movement, an operator presses the automatic movement-range setting button 335. If the automatic movement-range setting button 335 is pressed, the simulation device 300 refers to the diagnosis range management 453, and automatically sets the maximum movement range of the stem, as the movement range of the stem. With this operation, the movement range of each stem can be easily set. However, if the maximum movement range is set as a movement range, the number of interference check objects will increase. Thus, it is preferable that an appropriate movement range is set. The automatic movement-range setting button 335 is a first automatic setting button.

In Step 202 of FIG. 4, the virtual-movement-range calculation module 352 calculates virtual movement ranges of the stems and virtual movement ranges of components that move with the stems in the virtual space, by using the stroke (movement range) of each stem that is set as described above; and schematically displays the virtual movement ranges in the virtual-model display portion 340.

The virtual movement range of the NC 361 (stem 1) is schematically illustrated by a dotted line, as a virtual movement range 363 of the stem 1. Of the virtual movement range of the NC 361 (stem 1), the position of the fingers 362 at the lowermost position is schematically illustrated by a dotted line, as a position 364.

The virtual movement range of the NC 365 (stem 2) is schematically illustrated as a virtual movement range 367 of the stem 2. Of the virtual movement range of the NC 365 (stem 2), the position of the fingers 366 at the lowermost position is schematically illustrated by a dotted line, as a position 368.

The virtual movement range of the NC 369 (stem 3) is schematically illustrated by a dotted line, as a virtual movement range 371 of the stem 3.

In Step 203 of FIG. 4, the virtual-movement-range calculation module 352 extracts an area in which a virtual movement range of one stem overlaps with a virtual movement range of another stem, as an interference check area, by using the virtual movement range of each stem in the virtual space. That is, the virtual-movement-range calculation module 352 uses the virtual movement range of each stem, calculated in Step 202; and extracts stems that may interfere with each other when they move in accordance with the ladder program 800A.

Figure 7:
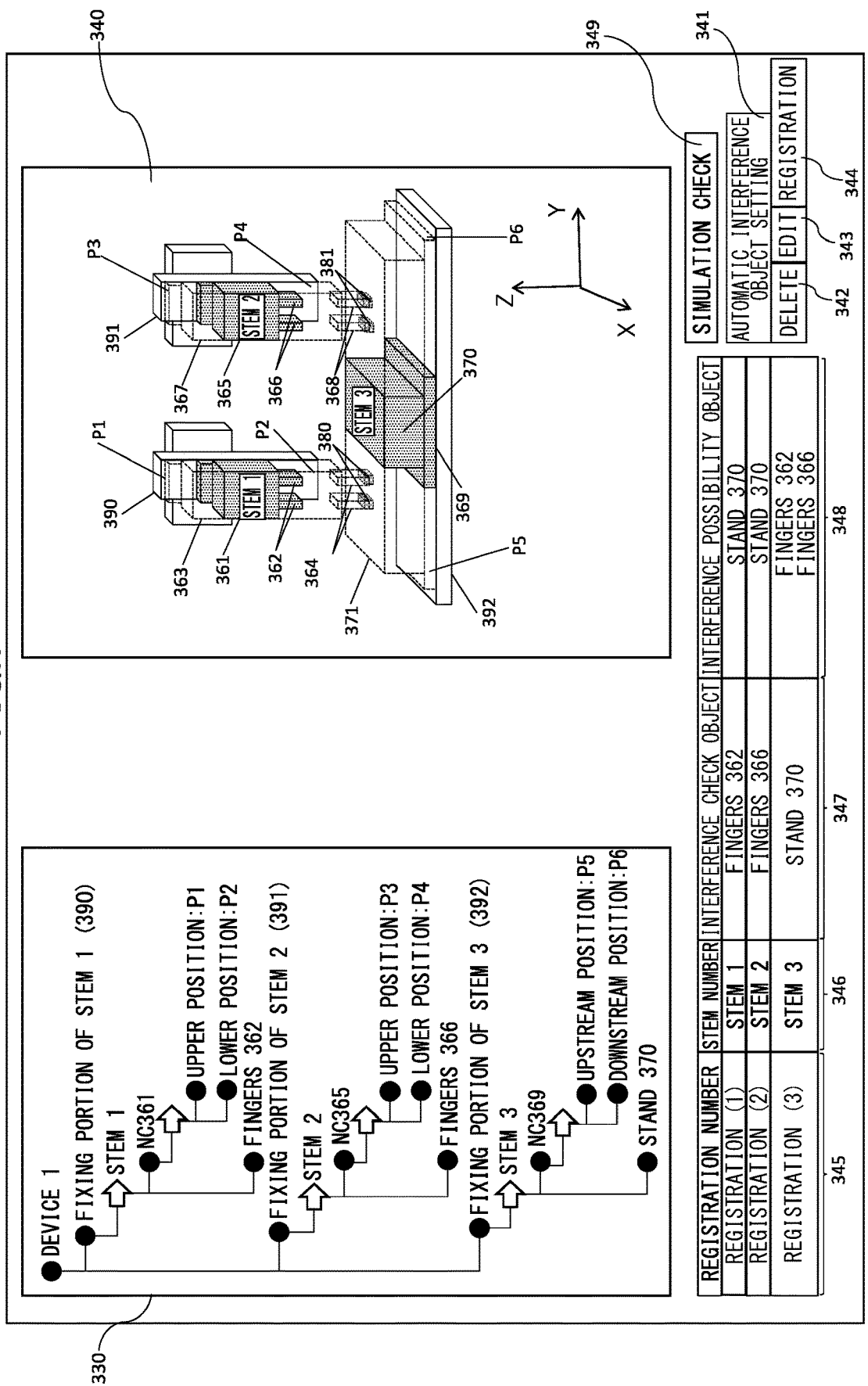
FIG. 7 is an example of a checking screen of the embodiment.

FIG. 7 is an example of a checking screen displayed on the display device 221 or 3210 when an operator checks stems, in Step 203 of FIG. 4, that may interfere with each other. When a user presses the interference check button 334 on the screen of FIG. 6, the screen of FIG. 6 transitions to the screen of FIG. 7.

In FIG. 7, an automatic interference-object setting button 341, a delete button 342, an edit button 343, a registration button 344, and a simulation check button 349 are illustrated. In addition, columns 345, 346, 347, and 348 are illustrated.

As illustrated in FIG. 5B, the virtual movement ranges 363, 367, and 371 overlap with each other in an area 380 in which the virtual movement range 363 and the virtual movement range 371 overlap with each other, and an area 381 in which the virtual movement range 367 and the virtual movement range 371 overlap with each other. However, there is no area (overlap area) in which the virtual movement range 363 of the NC 361 (stem 1) and the virtual movement range 367 of the NC 365 (stem 2) overlap with each other.

If an operator presses the automatic interference-object setting button 341 on the screen of FIG. 7, the virtual-movement-range calculation module 352 performs computation by using the virtual movement range of each stem, and displays the areas (overlap areas) 380 and 381 in the virtual-model display portion 340, in gray scale. In addition, components corresponding to interference check objects are displayed in the column 347, and interference possibility objects are displayed in the column 348. The interference possibility objects are objects that the interference check objects displayed in the column 347 may interfere with. In the column 346, a stem number of a stem that includes an interference check object is displayed. In the column 345, a registration number is displayed. The registration number is automatically assigned in accordance with the combination of an interference check object and an interference possibility object. The automatic interference-object setting button 341 is a second automatic setting button.

Since the area 380 exists, if the fingers 362 of the stem 1 are an interference check object, the stand 370 of the stem 3 is extracted as an object (interference possibility object) that the fingers 362 of the stem 1 may interfere with. In addition, since the area 381 exists, if the fingers 366 of the stem 2 are an interference check object, the stand 370 of the stem 3 is extracted as an object (interference possibility object) that the fingers 366 of the stem 2 may interfere with. In addition, since the areas 380 and 381 exist, if the stand 370 of the stem 3 is an interference check object, the fingers 362 of the stem 1 and the fingers 366 of the stem 2 are extracted as objects (interference possibility objects) that the stand 370 of the stem 3 may interfere with.

If the edit button 343 is pressed, interference check objects and interference possibility objects currently displayed in the columns 345 to 348 can be changed to other objects. In addition, a combination of objects that have not been extracted in the automatic interference-object setting process can be added and assigned with a new registration number.

If the delete button 342 is pressed, and then any registration number is pressed, the combination of an interference check object and an interference possibility object corresponding to the registration number can be deleted.

If the registration button 344 is pressed, the objects displayed in the columns 345 to 348 are registered as objects to be simulated. When the registration button 344 is pressed, Step 204 of FIG. 4 is executed. In Step 204, an interference check object extracted (or calculated) for each stem and a corresponding interference possibility object are associated with the stem, and registered in the interference check module 353.

If the simulation check button 349 is pressed, the checking screen transitions to a later-described screen for checking a simulation of operations of the objects displayed in the columns 345 to 348.

After the interference check objects are registered, the interference check module 353 and the stem module 351 start the simulation and the interference check in Step 205 of FIG. 4. Then, the process performs a computation in Step 206 of FIG. 4, to determine whether an interference is occurring in the virtual machine; and determines in Step 207 of FIG. 4 whether an interference is occurring.

Figure 8:
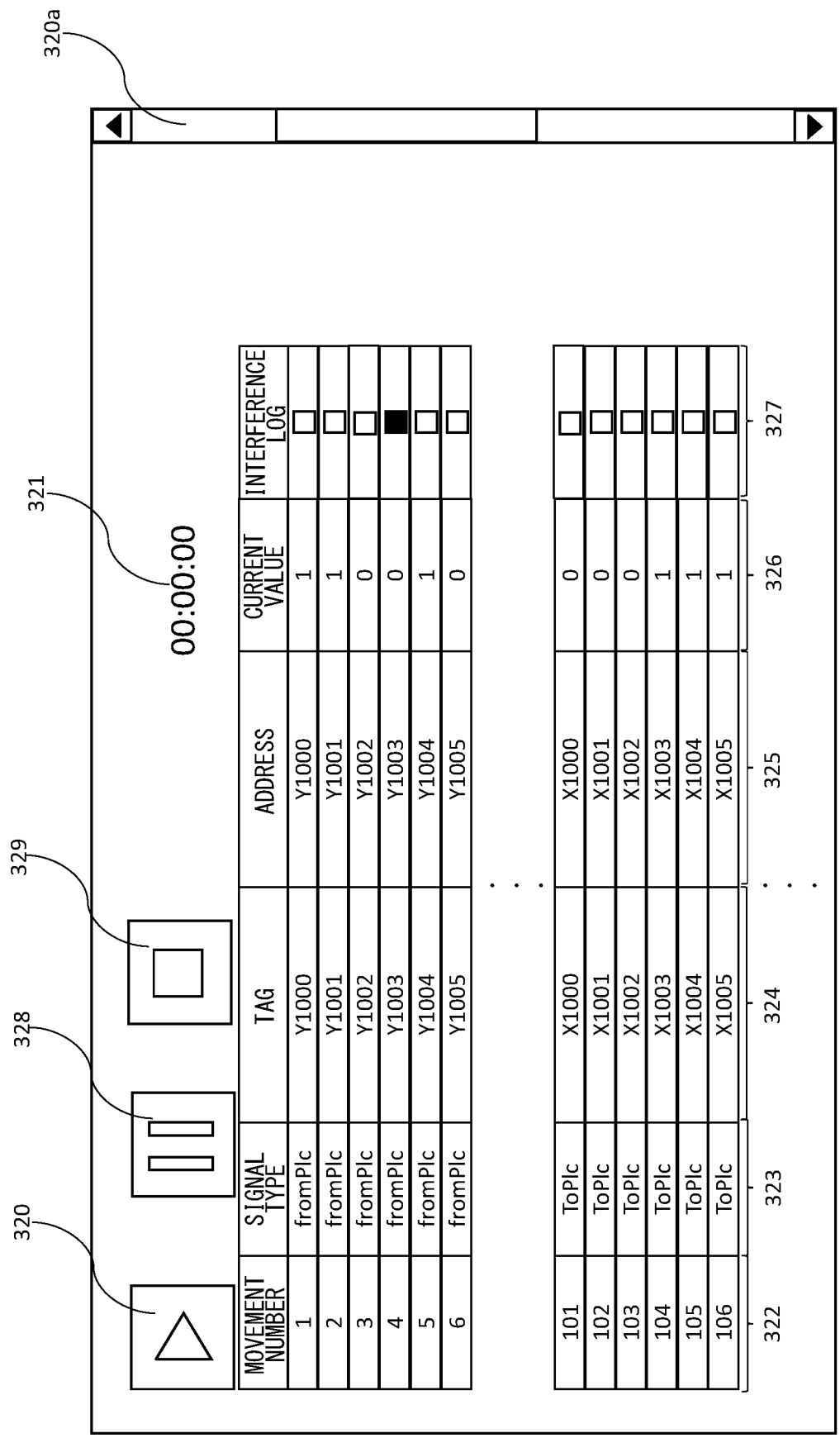
FIG. 8 is an example of an execution screen of the embodiment.

FIG. 8 is an example of an operation screen displayed on the display device 221 or 3210 when the simulation of operation is checked in Step 205 of FIG. 4. In FIG. 8, an execution button 320, a pause button 328, a stop button 329, and a time display 321 are illustrated. The execution button 320 is used to execute a simulation, the pause button 328 is used to pause the simulation, and the stop button 329 is used to stop the simulation. The time display 321 displays an elapsed time of the simulation. In addition, columns 322, 323, 324, 325, and 326, and a scroll bar 320a are illustrated. The columns 322 to 326 indicate detailed information on check objects. The column 322 indicates a movement number, the column 323 indicates a signal type, the column 324 indicates a tag, column 325 indicates an address, and the column 326 indicates a current value. These pieces of information are used for the PLC 500 to move each stem in the virtual space.

The column 322 indicates a number that is assigned to a unit of interference check movement in accordance with the ladder program 800A, the interference check object, and the interference possibility object. For example, the stem 1 performs a monotonous up-and-down movement, including an up-and-down movement at a timing 1 and an up-and-down movement at a timing 2. Since the up-and-down movement at the timing 1 and the up-and-down movement at the timing 2 have to be individually checked for the interference with the stem 3, different movement numbers are assigned to the up-and-down movement at the timing 1 and the up-and-down movement at the timing 2. The column 327 indicates an interference log. The interference log will be described later.

If the execution button 320 is pressed, the interference check module 353 and the stem module 351 execute the simulation by using the PLC 500 and the information on the ladder program 800A, the virtual movement range, the interference check object, and the interference possibility object. The time display 321 measures time having elapsed since the execution button 320 was pressed, and displays the time.

Then, the interference check module 353 and the stem module 351 check the occurrence of interference through the simulation in the movement number 1 (each of the movement numbers indicates a unit of interference check movement); and indicates the result in a table form. After that, the interference check module 353 and the stem module 351 similarly check the occurrence of interference and indicate the result in a table form, sequentially in the order of the movement numbers 2, 3, 4, . . . , 106. Any piece of information on the movements can be checked by scrolling the screen by using the scroll bar 320a.

If the process determines that an interference is occurring (Step 207: YES), then the process obtains information on the status of the PLC 500, in Step 208, via the second communication module 3700. Then the process outputs the information on the status of the PLC 500 and the information on an area in which the interference is occurring (the process outputs those pieces of information as interference information), to the display device 221 or 3210. Specifically, if an interference is occurring in a movement, a check box of an interference log included in the column 327 of FIG. 8 and corresponding to the movement number of the movement is filled in black. In FIG. 8, an interference is occurring in a movement with a movement number 4, and the check box of an interference log corresponding to the movement number 4 is filled in black.

In Step 209 of FIG. 4, the process determines whether to continue or end the simulation. Specifically, the process determines whether the later-described stop button 329 has been pressed. If the stop button 329 has not been pressed and the process continues the simulation, then the process proceeds to Step 210, and determines whether there remains a stem to be moved in the virtual space.

If there remains a stem to be moved in the virtual space, the process proceeds to Step 211 of FIG. 4, and continues to perform the simulation of operation and the interference check in accordance with the registered information on the interference check object and the interference possibility object. For example, if the NC 361 (stem 1) is to be moved, the process continues to perform the interference check on the stand 370 of the NC 369 (stem 3) in accordance with the registered information. If the NC 365 (stem 2) is to be moved, the process continues to perform the interference check on the stand 370 of the NC 369 (stem 3) in accordance with the registered information. In addition, if the NC 369 (stem 3) is to be moved, the process continues to perform the interference check on the NC 361 (Stem 1) and the NC 365 (stem 2) in accordance with the registered information.

If a plurality of stems is moving in parallel with each other, for example, if the NC 361 (stem 1) and the NC 365 (Stem 2) are moving in parallel with each other, the process continues to perform the interference check on each of the stems 1 and 2 in accordance with the registered information.

Then, if the process determines in Step 212 of FIG. 4 that an interference is occurring in a moving stem (Step 212: YES), then the process performs the same operation as that of Step 208, in Step 213.

The process repeats the above-described simulation. If the stop button 329 is pressed, or all the interference check objects of stems have been checked (S214: YES), then the process ends the simulation of FIG. 4, and makes the stop button 329 stand out. If the execution button 320 is pressed again after the simulation is ended, the process displays the simulation results again for replaying the simulation results, sequentially from the operation number 1. In addition, the elapsed time is measured again from 00:00:00, and displayed.

The pause button 328 is used when an operator desires to pause the simulation or replay. If the pause button 328 is pressed, the time displayed by the time display 321 is paused, and the display of detailed information on the movement, displayed in a table form, and the display of the interference log are also paused. If the execution button 320 is pressed again in the pause state, the simulation and the measurement of the time displayed by the time display 321 are resumed, and the display of detailed information on the movement, displayed in a table form, and the display of the interference log are also resumed.

If the stop button 329 is pressed, an interrupt occurs to stop the simulation if the simulation is being performed, and the process ends the simulation, regardless of whether all the movements of stems that include the interference check objects have been checked in the steps 209 and 214 of FIG. 4. If the interrupt occurs while the simulation results are being replayed, the replay goes back to the operation number 1, and the time displayed by the time display 321 is reset to 00:00:00.

In another embodiment to check the simulation, the execution screen may be displayed on the display device 3210, as illustrated in FIG. 9. In FIG. 9, the virtual-model display portion 340 is displayed in the execution screen. If the execution button 320 is pressed, the display of detailed information on the movement, displayed in a table form, and the display of the interference log are displayed; and a stem moves in the virtual-model display portion 340, in synchronization with a corresponding operation number. Thus, the execution of the simulation can be displayed so as to be visually and easily understood. If the pause button 328 is pressed, the time displayed by the time display 321, the display of detailed information on the movement, displayed in a table form, the display of the interference log, and the operation of the virtual-model display portion 340 are paused.

If the execution button 320 is pressed again after the simulation is ended, the process displays the simulation results again, sequentially from the operation number 1, for replaying the simulation results. In the replay, the process measures the time from 00:00:00; and highlights a component corresponding to an operation number, in the virtual-model display portion 340, sequentially from the operation number 1.

With this operation, an operator can visually and easily check the simulation of operation, and can easily understand which stem and which movement causes an interference.

In FIG. 9, a forward button 328a and a backward button 328b are additionally provided. If the forward button 328a is pressed in a state where a movement corresponding to any one of the operation numbers is displayed and paused in the virtual-model display portion 340, a movement corresponding to a movement number next to the displayed movement number is displayed in the virtual-model display portion 340 while looped (repeated). In contrast, if the backward button 328b is pressed in a state where a movement corresponding to any one of the operation numbers is displayed and paused in the virtual-model display portion 340, a movement corresponding to a movement number previous to the displayed movement number is displayed in the virtual-model display portion 340 while looped. Thus, if the forward button 328a or the backward button 328b is successively pressed, the movements corresponding to the operation numbers can be checked one after another. Also, in this case, each movement is displayed in the virtual-model display portion 340 while looped.

Furthermore, a display style of a line that includes a movement number corresponding to a movement displayed in the virtual-model display portion 340 is made different from a display style of the other lines. In FIG. 9, a line that includes the movement number 5 is displayed in gray scale, and made different in display style from the other lines. If the forward button 328a is pressed in this state, a line that includes the movement number 6 is displayed in gray scale, and a movement corresponding to the movement number 6 is displayed in the virtual-model display portion 340 while looped. In contrast, if the backward button 328b is pressed, a line that includes the movement number 4 is displayed in gray scale, and a movement corresponding to the movement number 4 is displayed in the virtual-model display portion 340 while looped.

Thus, since the forward button 328a and the backward button 328b are provided, and a display style of a line that includes a movement number corresponding to a movement displayed in the virtual-model display portion 340 is made different from a display style of the other lines, an operator can easily check each unit of the movements. Therefore, the operability for operators can be improved.

As described above, in the present embodiment, objects of stems whose virtual movement ranges overlap with each other are determined as check objects, by using the stroke (movement range) of each stem; and the check objects are displayed so as to be recognized by an operator. With this operation, stems that may cause interference when moved by the ladder program can be efficiently simulated. In addition, since the number of check objects can be decreased, the amount of information processing can be decreased. In addition, since the stems are virtually moved in the virtual space, an operator can perform offline debugging while checking the interference in real time.

The present invention is not limited to the above-described embodiments and examples, and may be variously modified within the technical concept of the present invention. For example, an object such as a production device on which the simulation of operation is performed in the virtual space is not limited to the transfer device of the embodiment, and may be any one of various automatic machines such as robots. The simulation of operation may be an offline simulation. In addition, the present disclosure can be applied to any automatic machine that can automatically perform expansion and contraction motion, bending and stretching motion, up-and-down motion, right-and-left motion, pivot motion, or combination motion thereof, depending on information data stored in the storage device of the control device.

In addition, an automatic machine designed by using the simulation device or the simulation method of the present embodiment may actually be made and connected with the simulation device of the present embodiment. In this case, a simulation operation performed by the simulation device of the embodiment in the virtual space may be performed on line by using the actual automatic machine, or products may be manufactured by operating the actual automatic machine by using a debugged operation program. In this case, the simulation device of the embodiment can be used as a control device for the automatic machine, and the simulation device can be operated in accordance with the simulation method, which uses the test pattern of the embodiment and which serves as a control method for the automatic machine.

The functions of the above-described diagnosis device 200, simulation device 300, management device 400, and PLC 500 may be achieved by one or more computers (information processing devices). For example, the functions of the diagnosis portion, the simulation portion, and the management portion may be achieved by not only three computers, but also one, two, or four or more computers. In addition, the function of the PLC 500 may be achieved by a computer (information processing device) that has the function of the diagnosis portion, the simulation portion, or the management portion.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-14674, filed Jan. 31, 2020, and Japanese Patent Application No. 2020-181811, filed Oct. 29, 2020, which are hereby incorporated by reference herein in their entirety.

What is claimed is:

1. An information processing device configured to virtually execute motion of a system comprising a plurality of apparatuses, the information processing device comprising:
a display portion; and
a control portion configured to:
automatically extract at least two apparatuses whose movement spaces overlap with each other from the plurality of apparatuses on a basis of movement spaces that have been set for each of the plurality of apparatuses, before checking interference of apparatuses in virtual space;
display the at least two apparatuses that have been extracted on the display portion and not display apparatuses of which movement spaces do not overlap, as check objects for checking interference;
virtually execute motion of the at least two apparatuses simultaneously in the virtual space and check whether or not the at least two apparatuses interfere with each other within a range where the movement spaces of the at least two apparatuses overlap with each other;
display a virtual-model display portion in which the device is displayed as a virtual model, on the display portion;
cause the virtual-model display portion to display a virtual movement of the check objects; and
display an execution button, a pause button, a forward button, and a backward button on the display portion, wherein the execution button causes the virtual-model display portion to execute a virtual movement of the check objects, the pause button causes the virtual-model display portion to pause the virtual movement of the check objects, the forward button and the backward button cause the virtual-model display portion to select the virtual movement of the check objects, and when the forward button or the backward button is pressed in a state where the pause button is pressed, a unit motion of the virtual movement selected by pressing the forward button or pressing the backward button is displayed in the virtual-model display portion while looped.

2. The information processing device according to claim 1, wherein the control portion is configured to display a setting screen used to set the movement spaces, on the display portion.

3. The information processing device according to claim 2, wherein the control portion is configured to display a position input portion used to input positions to which the plurality of apparatuses move, on the setting screen.

4. The information processing device according to claim 3, wherein the control portion is configured to display a relationship between the device, the plurality of apparatuses, and the positions, on the setting screen in a tree view form.

5. The information processing device according to claim 2, wherein the control portion is configured to display a first automatic setting button used to automatically set the movement spaces, on the setting screen.

6. The information processing device according to claim 1, wherein the control portion is configured to display a checking screen used to check the check objects, on the display portion.

7. The information processing device according to claim 1, wherein the control portion is configured to display a combination of check objects to be checked, on the checking screen in accordance with an area in which one movement space overlaps with another movement space.

8. The information processing device according to claim 7, wherein the control portion is configured to display a second automatic setting button used to automatically display the combination, on the checking screen.

9. The information processing device according to claim 7, wherein the control portion is configured to display a delete button used to delete the combination and an edit button used to edit the combination, on the checking screen.

10. The information processing device according to claim 1, wherein the control portion is configured to display an operation screen used to display a virtual movement of the check objects, on the display portion.

11. The information processing device according to claim 10, wherein the control portion is configured to display an execution status of the virtual movement, on the operation screen in a table form.

12. The information processing device according to claim 10, wherein the control portion is configured to display whether an interference is occurring in the check objects, on the operation screen.

13. The information processing device according to claim 1, wherein the control portion is configured to cause the display portion to:

display, in a table form, detailed information on a virtual movement of the check objects displayed in the virtual-model display portion, and make a display style of a line corresponding to the virtual movement of the check objects displayed in the virtual-model display portion, different from a display style of other lines corresponding to other movements.

14. The information processing device according to claim 13, wherein the control portion is configured to cause the display portion to synchronize a display displayed by the virtual-model display portion, with the detailed information displayed in the table form, in accordance with operation of the forward button and the backward button.

15. The information processing device according to claim 1, wherein when the control portion causes the virtual-model display portion to display a virtual movement of the check objects, the control portion causes the virtual-model display portion to display the virtual movement of the check objects such that the virtual movement is looped.

16. A production device comprising:

an information processing device configured to virtually execute motion of a system comprising a plurality of apparatuses, the information processing device comprising:

a display portion; and a control portion configured to automatically extract at least two apparatuses whose movement spaces overlap with each other from the plurality of apparatuses on a basis of movement spaces that have been set for each of the plurality of apparatuses, before checking interference of apparatuses in virtual space, display the at least two apparatuses that have been extracted on the display portion and not display apparatuses of which movement spaces do not overlap, as check objects for checking interference, virtually execute motion of the at least two apparatuses simultaneously in the virtual space and check whether or not the at least two apparatuses interfere with each other within a range where the movement spaces of the at least two apparatuses overlap with each other, display a virtual-model display portion in which the device is displayed as a virtual model, on the display portion, cause the virtual-model display portion to display a virtual movement of the check objects, and display an execution button, a pause button, a forward button, and a backward button on the display portion, wherein the execution button causes the virtual-model display portion to execute a virtual movement of the check objects, the pause button causes the virtual-model display portion to pause the virtual movement of the check objects, the forward button and the backward button cause the virtual-model display portion to select the virtual movement of the check objects, and when the forward button or the backward button is pressed in a state where the pause button is pressed, a unit motion of the virtual movement selected by pressing the forward button or pressing the backward button is displayed in the virtual-model display portion while looped.

17. A method of manufacturing products by using a production device having an information processing device configured to virtually execute motion of a system comprising a plurality of apparatuses, the method comprising:

automatically extracting at least two apparatuses whose movement spaces overlap with each other from the plurality of apparatuses on a basis of movement spaces that have been set for each of the plurality of apparatuses, before checking interference of apparatuses in virtual space;

displaying the at least two apparatuses that have been extracted on a display portion and not displaying apparatuses of which movement spaces do not overlap, as check objects for checking interference, virtually executing motion of the at least two apparatuses simultaneously in the virtual space and checking whether or not the at least two apparatuses interfere with each other within a range where the movement spaces of the at least two apparatuses overlap with each other, displaying a virtual-model display portion in which the device is displayed as a virtual model, on the display portion, causing the virtual-model display portion to display a virtual movement of the check objects, and displaying an execution button, a pause button, a forward button, and a backward button on the display portion, wherein the execution button causes the virtual-model display portion to execute a virtual movement of the check objects, the pause button causes the virtual-model display portion to pause the virtual movement of the check objects, the forward button and the backward button cause the virtual-model display portion to select the virtual movement of the check objects, and when the forward button or the backward button is pressed in a state where the pause button is pressed, a unit motion of the virtual movement selected by pressing the forward button or pressing the backward button is displayed in the virtual-model display portion while looped.

18. An information processing method that virtually moves a system comprising a plurality of apparatuses and that is executed by a control portion, the information processing method comprising:

automatically extracting at least two apparatuses whose movement spaces overlap with each other from the plurality of apparatuses on a basis of movement spaces that have been set for each of the plurality of apparatuses, before checking interference of apparatuses in virtual space;

displaying the at least two apparatuses that have been extracted on a display portion and not displaying apparatuses of which movement spaces do not overlap, as check objects for checking interference;

virtually executing motion of the at least two apparatuses simultaneously in the virtual space and checking whether or not the at least two apparatuses interfere with each other within a range where the movement spaces of the at least two apparatuses overlap with each other;

displaying a virtual-model display portion in which the device is displayed as a virtual model, on the display portion;

causing the virtual-model display portion to display a virtual movement of the check objects; and displaying an execution button, a pause button, a forward button, and a backward button on the display portion, wherein the execution button causes the virtual-model display portion to execute a virtual movement of the check objects, the pause button causes the virtual-model display portion to pause the virtual movement of the check objects, the forward button and the backward button cause the virtual-model display portion to select the virtual movement of the check objects, and when the forward button or the backward button is pressed in a state where the pause button is pressed, a unit motion of the virtual movement selected by pressing the forward button or pressing the backward button is displayed in the virtual-model display portion while looped.

19. A computer-readable non-transitory recording medium storing a control program that causes a computer to execute an information processing method that virtually moves a system comprising a plurality of apparatuses and that is executed by a control portion, the information processing method comprising: automatically extracting at least two apparatuses whose movement spaces overlap with each other from the plurality of apparatuses on a basis of movement spaces that have been set for each of the plurality of apparatuses, before checking interference of apparatuses in virtual space;

displaying the at least two apparatuses that have been extracted on a display portion and not displaying apparatuses of which movement spaces do not overlap, as check objects for checking interference, virtually executing motion of the at least two apparatuses simultaneously in the virtual space and checking whether or not the at least two apparatuses interfere with each other within a range where the movement spaces of the at least two apparatuses overlap with each other, displaying a virtual-model display portion in which the device is displayed as a virtual model, on the display portion, causing the virtual-model display portion to display a virtual movement of the check objects, and displaying an execution button, a pause button, a forward button, and a backward button on the display portion, wherein the execution button causes the virtual-model display portion to execute a virtual movement of the check objects, the pause button causes the virtual-model display portion to pause the virtual movement of the check objects, the forward button and the backward button cause the virtual-model display portion to select the virtual movement of the check objects, and when the forward button or the backward button is pressed in a state where the pause button is pressed, a unit motion of the virtual movement selected by pressing the forward button or pressing the backward button is displayed in the virtual-model display portion while looped.

20. The information processing device according to claim 5, wherein the first automatic setting button causes the control portion to automatically set maximum spaces of movement of the plurality of apparatuses as the movement spaces.

21. The information processing device according to claim 1, wherein the control portion is configured to display an area in which one movement space overlaps with another movement space, on the display portion.

22. The information processing device according to claim 1, wherein the control portion is configured to display the at least two apparatuses on the display portion as check objects, that may interfere with each other.

23. The information processing device according to claim 1, wherein the information processing device further comprises a register portion, and wherein the control portion is configured to register an information of the at least two apparatuses in the register portion.

24. The information processing device according to claim 1, wherein the control portion is configured not to extract the apparatuses of which movement spaces do not overlap, as check objects to be virtually operated for checking interference.

25. The information processing device according to claim 1, wherein the control portion is configured to virtually operate the at least two apparatuses on a basis of a signal, which is sent from a PLC (Programmable Logic Controller).

26. The information processing device according to claim 1, wherein the control portion is configured to extract the at least two apparatuses depending on a ladder program, virtually operate the at least two apparatuses on a basis of a signal, which is sent from a PLC (Programmable Logic Controller) depending on the ladder program, and check an interference of the at least two apparatuses.

27. The information processing device according to claim 1, wherein the movement spaces of the plurality of apparatuses correspond to maximum movement spaces of the plurality of apparatuses or predetermined spaces set within the maximum movement spaces.

28. The information processing device according to claim 12, wherein the unit motion of the virtual movement is displayed in a style of a line.

29. The information processing device according to claim 1, wherein the control portion is configured to display a stop button, and wherein, if the stop button is pressed, the control portion stops the virtual movement in a case the virtual movement is running.

30. The information processing device according to claim 13, wherein, by pressing the execution button, the table form and the display in the virtual-model display portion are updated in synchronization.

31. The information processing device according to claim 11, wherein the control portion is configured to display a check box of an interference log filled in black in a case where the at least two apparatuses interfere with each other.

* * * * *